United States Patent
Kirn

(10) Patent No.: US 6,538,504 B1
(45) Date of Patent: Mar. 25, 2003

(54) SWITCHING AMPLIFIER CROSSOVER DISTORTION REDUCTION TECHNIQUE

(75) Inventor: Larry Kirn, West Bloomfield, MI (US)

(73) Assignee: JAM Technologies, LLC, Boston, MA (US)

( * ) Notice: Subject to any disclaimer, the term of this patent is extended or adjusted under 35 U.S.C. 154(b) by 0 days.

(21) Appl. No.: 09/980,837
(22) PCT Filed: May 19, 2000
(86) PCT No.: PCT/US00/13854
§ 371 (c)(1), (2), (4) Date: Nov. 15, 2001
(87) PCT Pub. No.: WO00/70747
PCT Pub. Date: Nov. 23, 2000
(51) Int. Cl.[7] .............................. H03F 3/38; H03F 21/00; H03F 3/217
(52) U.S. Cl. ....................... 330/10; 330/207 A; 330/251
(58) Field of Search ................................ 330/10, 207 A, 330/251

(56) References Cited

U.S. PATENT DOCUMENTS

| 3,900,823 | A | * | 8/1975 | Sokal et al. | 330/129 |
| 4,306,255 | A | * | 12/1981 | Misaki et al. | 360/71 |
| 4,404,526 | A | | 9/1983 | Kirn | 330/10 |
| 4,773,096 | A | | 9/1988 | Kirn | 381/120 |
| 5,652,482 | A | * | 7/1997 | Tripod | 315/370 |
| 6,031,421 | A | | 2/2000 | McEwan | 330/10 |

* cited by examiner

Primary Examiner—Patricia Nguyen
(74) Attorney, Agent, or Firm—Gifford, Krass, Groh, Sprinkle, Anderson & Citkowski, PC

(57) ABSTRACT

Apparatus and methods minimize propagation delay distortion in a switching amplifier (111) without impacting system efficiency. Circuitry (400) is used to detect when the width of an output pulse is approaching, or is less than, the propagation delay of switching devices in the output stage and, if this is the case, the width of the output pulse is artificially adjusted a function of the delay. More particularly alternate pulses, the invention adds the width "N", being twice the minimum accurate width, to the desired width for output, or subtracts the desired width from the width "N" for the output while inverting the polarity of the output. In so doing, the desired width is alternately added to, and subtracted from, the width "N", thus enforcing an accurately achievable minimum pulse width without irpposing error. When applied to a bridged switching output stage, system switching losses remain those of a single switching output.

3 Claims, 3 Drawing Sheets

SWITCHING AMPLIFIER CROSSOVER DISTORTION REDUCTION TECHNIQUE

FIELD OF THE INVENTION

This invention relates generally to switching amplifiers and, in particular, to apparatus and methods for reducing distortion as pulse widths approach zero.

BACKGROUND OF THE INVENTION

Switching amplifiers often rely on the control of a filtered output voltage by modulating the width of constant-voltage switching outputs. The technique is commonly referred to as pulse-width modulation, or PWM. As these pulse widths approach zero, distortion is introduced in that all known switching devices exhibit propagation delays and therefore are incapable of accurately producing pulses shorter than the aggregate of these delays in a signal chain. Since the resulting distortion is at its worst approaching zero output, "crossover distortion," a particularly noticeable form of distortion, arises.

One approach used to null these delays has been to modulate a differential pair of outputs, in a bridge configuration, in opposing directions from a median of 50%. This technique is shown in U.S. Pat. Nos. 4,404,526 entitled "High Fidelity Audio Encoder/Amplifier" and 4,773,096 entitled "Digital Switching Power Amplifier," the entire contents of both of which are incorporated herein by reference. With approximately equal delays extant in both outputs, the distortion is thereby greatly reduced. This approach, however, mandates that both outputs continuously switch, which increases system switching losses.

SUMMARY OF THE INVENTION

The present invention resides in a technique for minimizing propagation delay distortion in a switching amplifier without impacting system efficiency. Broadly, the circuitry and accompanying methods of operation are used to detect when the width of an output pulse is approaching, or is less than, the propagation delay of switching devices in the output stage and, if this is the case, the width of the output pulse is artificially adjusted a function of the delay.

More particularly, the invention detects when the amplifier attempts to reproduce sufficiently short duration pulses and, on alternate pulses, adds the width 'N', being twice the minimum accurate width, to the desired width for output, or subtracts the desired width from the width 'N' for the output while inverting the polarity of the output.

The net effect is that the desired width is alternately added to, and subtracted from, the width 'N', thus enforcing an accurately achievable minimum pulse width without imposing error. When applied to a bridged switching output stage, system switching losses remain those of a single switching output.

DETAILED DESCRIPTION OF THE INVENTION

Figure 1:
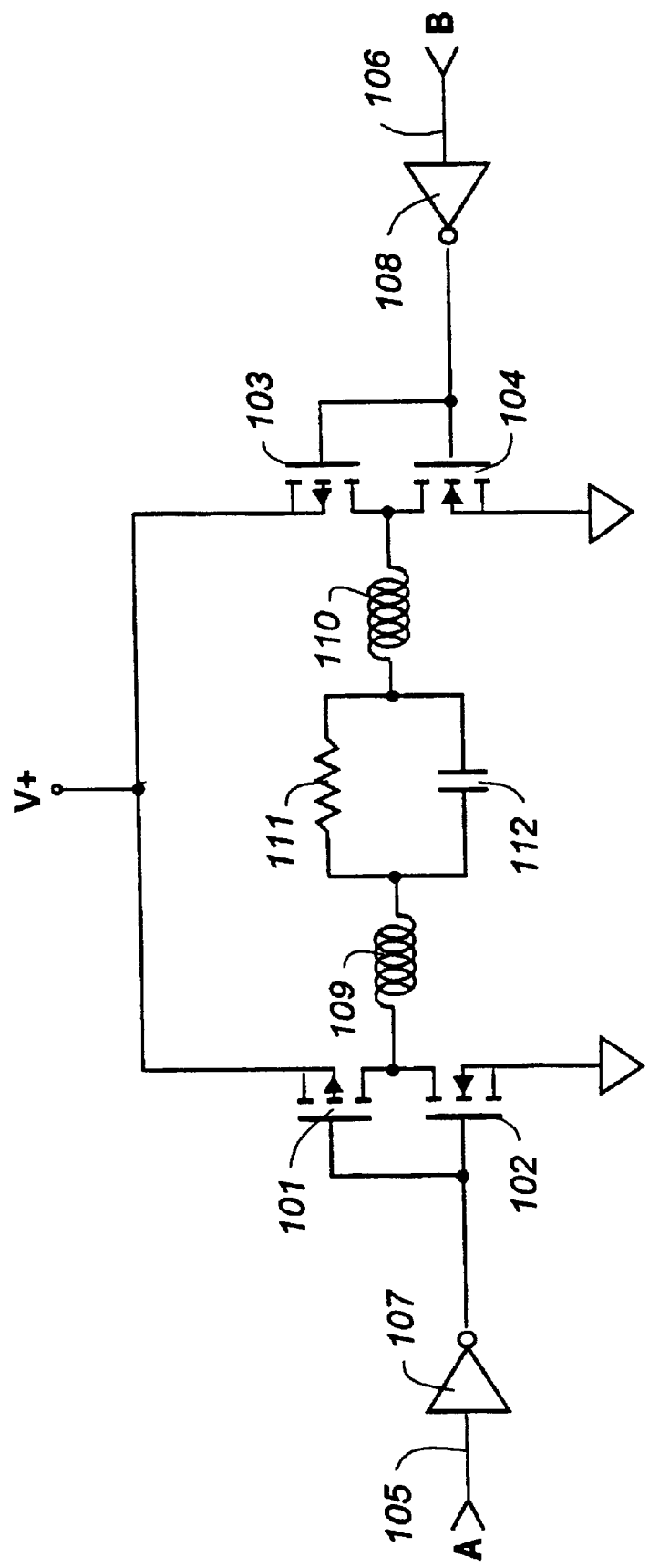
FIG. 1 shows the output stage of a typical bridged output pulse-width-modulated switching amplifier.

FIG. 1 shows the output stage of a typical bridged output pulse-width-modulated switching amplifier. Switching devices 101 and 102 are respectively connected so as to provide either the positive power supply V+ or ground to filter inductor 109. Similarly, switching devices 103 and 104 are respectively connected so as to provide either the positive power supply V+ or ground to filter inductor 110. Inductors 109 and 110 form a lowpass filter in conjunction with capacitor 112 to supply differential voltage across load 111.

Control of switching devices 101 and 102 is effected by inverting driver 107, under control of control signal 105. Control of switching devices 103 and 104 is effected by inverting driver 108, under control of control signal 106. In that all switching devices shown invert their incoming control voltages, inverting drivers 107 and 108 are incorporated in order to show output voltages of the same polarity as their respective control signals. Hence, a high control signal input on either side A or side B results in a high output on that side.

Figure 2:
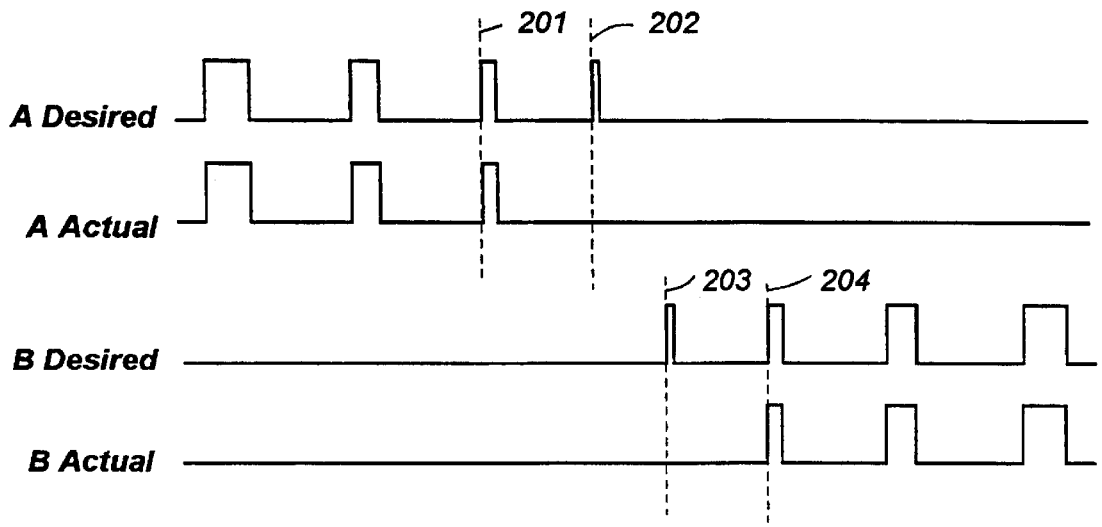
FIG. 2 shows desired (input) and actual (output) waveforms of the amplifier of FIG. 1 as its output crosses through zero.

Referring to FIG. 2, input waveforms A-Desired and B-Desired, of a typical bridged switching amplifier are shown as the output slowly crosses through zero. Of particular interest are the pulses at times 201 and 204, which, being slightly shorter than the aggregate of switching device delays, are elongated in output waveforms A-Actual and B-Actual. Output distortion thereby caused is exacerbated by the fact that pulses at times 202 and 203 are entirely absent in A-Actual and B-Actual, respectively, being less than the aggregate of switching device delays.

Figure 3:
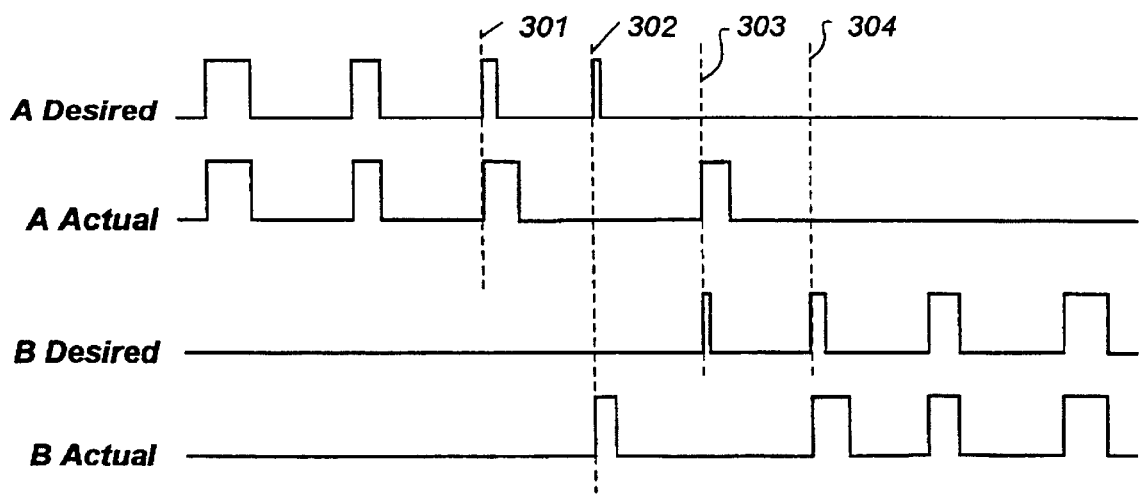
FIG. 3 shows desired (input) and actual (output) waveforms according to the present invention as the output crosses through zero.

Referring now to FIG. 3, desired input and actual output waveforms A and B are shown with respect to a bridged switching amplifier incorporating the present invention as the output again slowly crosses through zero. Note th at the A-Actual output pulse at time 301 is formed by the result of adding the desired width to 'N'.

The B-Actual output pulse at time 304 then appears on the opposing output, the result of subtracting the desired width from 'N'.

An A-Actual output pulse at time 303 appears on its opposing output of B-Desired input, again the result of subtracting the desired width from 'N', and a B-Actual output pulse at time 304 appears on its natural output, the result of adding the desired width to 'N'. By imposing minimum pulse widths in this fashion, elongation and missing pulses are avoided, while the imposed minimum is nulled. Note that each pulse appears on a single output at any given time.

Figure 4:
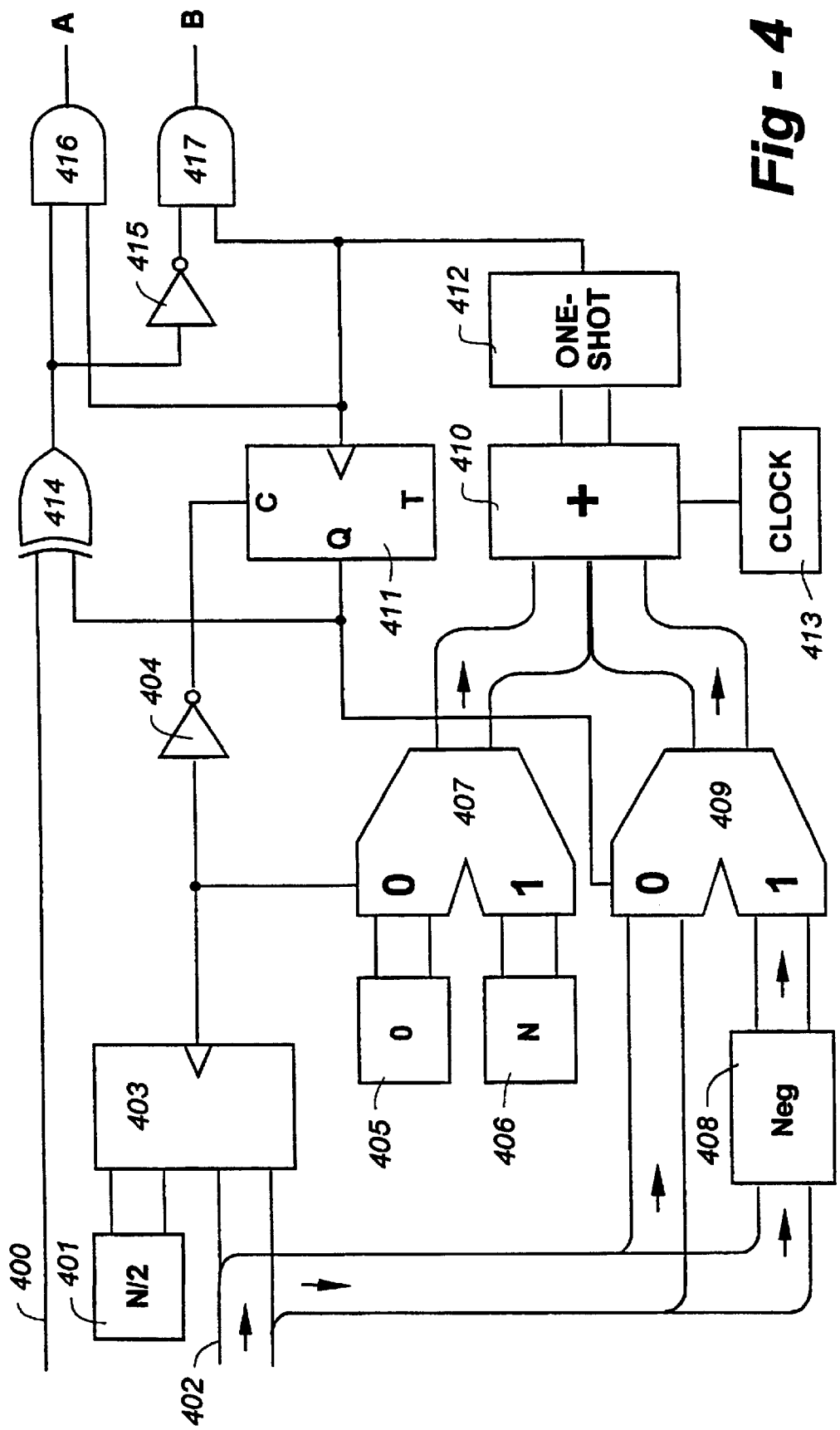
FIG. 4 is a block diagram of preferred circuitry implementing the invention.

Referring now to FIG. 4, desired pulse-width data stream 402 feeds magnitude comparator 403, the other input of which is fed the constant 'N'/2 401. The output of 402 comparator 402 controls multiplexer 407, which selects for output the constant '0' 405 if the incoming data value is not less than 'N'/2, or the constant 'N' 406 if the incoming data value is less than 'N'/2.

The output of multiplexer 407 is presented as one input to adder 410. The output of comparator 403 is inverted by inverter 404, so as to clear T flip-flop 411 if the incoming data value is not less than 'N'/2. In the event that it is not so cleared, T flip-flop 411 toggles its output on each output pulse of one-shot 412. The incoming data stream 402 is as well presented as one input of multiplexer 409 and negated by negator 408 to supply the second input of multiplexer 409. Multiplexer 409 outputs the true data stream 402 when T flip-flop 411 outputs a zero, and its negation when T flip-flop outputs a one.

The output of multiplexer 409 provides the second input of adder 410. The output of adder 410 controls the pulse width of one-shot 412, triggered by clock source 413. Desired polarity indicator 400 is input to exclusive OR gate 414, with the output of T flip-flop 411. This arrangement inverts the indicated polarity when T flip-flop 411 outputs a one. The output of exclusive OR gate 414, when one, enables the output of one-shot 412 to output A through AND gate 416, or to output B, when zero, via inverter 415 through AND gate 417.

I claim:

1. In a switching amplifier having an output stage generating output pulses with one or more switching devices exhibiting an aggregate delay, a method of reducing distortion comprising the steps of:

detecting when the width of an output pulse is approaching, or is less than, the aggregate delay; and, if this is the case, adjusting the width of the output pulse as a function of the aggregate delay to reduce distortion.

2. The method of claim 1, wherein:

the switching devices are coupled to a load having first and second terminals; and the step of adjusting the width of the output pulse includes increasing the width of the pulse if applied to the first terminal of the load, and decreasing the width of the pulse if applied to the second terminal of the load.

3. A method of reducing distortion in a switching amplifier, comprising the steps of:

defining N as twice the minimum output pulse width that can be accurately reproduced by the amplifier;

detecting when an output pulse is approaching, or is less than, N/2; and, if so, performing the following operations on alternating output pulses:

a) adding N to the output pulse width, and b) subtracting N from the output pulse width and inverting the polarity of the output.

* * * * *

UNITED STATES PATENT AND TRADEMARK OFFICE
CERTIFICATE OF CORRECTION

PATENT NO. : 6,538,504 B1
DATED : March 25, 2003
INVENTOR(S) : Kirn

It is certified that error appears in the above-identified patent and that said Letters Patent is hereby corrected as shown below:

<u>Title page,</u>
Item [57], ABSTRACT,
Lines 7-8, replace "particularly alternate" with -- particularly, on alternate --.
Line 14, replace "irpposing" with -- imposing --.

<u>Column 2,</u>
Line 40, replace "th at" with -- that --.
Lines 57-58, replace "of 402 comparator" with -- of comparator --.

Signed and Sealed this

Twenty-fourth Day of June, 2003

JAMES E. ROGAN
*Director of the United States Patent and Trademark Office*